United States Patent
Li et al.

(10) Patent No.: US 10,878,880 B2
(45) Date of Patent: Dec. 29, 2020

(54) SELECTIVE VOLATILE MEMORY REFRESH VIA MEMORY-SIDE DATA VALID INDICATION

(71) Applicant: QUALCOMM INCORPORATED, San Diego, CA (US)

(72) Inventors: Yanru Li, San Diego, CA (US); Dexter Chun, San Diego, CA (US); Pratik Patel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 54 days.

(21) Appl. No.: 16/137,496

(22) Filed: Sep. 20, 2018

(65) Prior Publication Data

US 2020/0098420 A1    Mar. 26, 2020

(51) Int. Cl.
*G06F 3/06* (2006.01)
*G11C 11/406* (2006.01)

(52) U.S. Cl.
CPC ...... *G11C 11/40622* (2013.01); *G06F 3/0619* (2013.01); *G06F 3/0659* (2013.01); *G06F 3/0673* (2013.01); *G11C 11/40611* (2013.01)

(58) Field of Classification Search
CPC combination set(s) only.
See application file for complete search history.

(56) References Cited

U.S. PATENT DOCUMENTS

| | | | |
|---|---|---|---|
| 9,336,855 B2 | 5/2016 | Lo et al. | |
| 2017/0091087 A1* | 3/2017 | Cui | G11C 11/40622 |
| 2017/0270050 A1 | 9/2017 | Jin | |
| 2017/0352406 A1 | 12/2017 | Querbach et al. | |
| 2018/0053569 A1 | 2/2018 | Xiao et al. | |

FOREIGN PATENT DOCUMENTS

WO    WO2017151567    9/2017

* cited by examiner

*Primary Examiner* — Yong J Choe
(74) *Attorney, Agent, or Firm* — Smith Tempel Blaha LLC

(57) ABSTRACT

Systems, methods, and computer programs are disclosed for refreshing a volatile memory. An embodiment of a method comprises storing, in a volatile memory device comprising a cell array having a plurality of rows with a corresponding row address, a table specifying one of a data valid indicator and a data invalid indicator for each of the plurality of row addresses. The data valid indicator specifies that the corresponding row is in use, and the data invalid indicator specifies that the corresponding row is not in use. A memory controller initiates a refresh command. In response to the refresh command, the rows having the data valid indicator are refreshed while the rows having the data invalid indicator are skipped.

23 Claims, 12 Drawing Sheets

| ROW ADDRESS | VALID INDICATOR 1= "in use" 0 = "not used" |
|---|---|
| 0 | 0 |
| 1 | 1 |
| 2 | 0 |
| ... | |
| 255 | 0 |
| 256 | 1 |
| ... | |
| 511 | 0 |
| ... | |
| 7936 | 0 |
| ... | |
| 8191 | 0 |

Rows 0–255: 256-bit sector 1
Rows 256–511: 256-bit sector 2
Rows 7936–8191: 256-bit sector 32

FIG. 7

SELECTIVE VOLATILE MEMORY REFRESH VIA MEMORY-SIDE DATA VALID INDICATION

DESCRIPTION OF THE RELATED ART

Portable computing devices (e.g., cellular telephones, smart phones, tablet computers, portable digital assistants (PDAs), portable game consoles, wearable devices, and other battery-powered devices) and other computing devices continue to offer an ever-expanding array of features and services, and provide users with unprecedented levels of access to information, resources, and communications. To keep pace with these service enhancements, such devices have become more powerful and more complex. Portable computing devices now commonly include a system on chip (SoC) comprising a plurality of memory clients embedded on a single substrate (e.g., one or more central processing units (CPUs), a graphics processing unit (GPU), digital signal processors (DSPs), etc.). The memory clients may read data from and store data in an external dynamic random access memory (DRAM) electrically coupled to the SoC via a high-speed bus, such as, a double data rate (DDR) bus.

DDR capacity in consumer electronic devices continues to increase, which results in higher system power consumption from DRAM refresh. For example, existing premium-tier mobile devices typically comprise 6-8 GB of DDR memory, where a typical high-level operating system (HLOS) usage with system applications can run within 2-3 GB of DDR memory. DRAM technology provides refresh power-saving features, such as, partial array self-refresh (PASR), but the coarse granularity (e.g., tens of MB) may require extra HLOS overhead to migrate pages or kill applications.

Accordingly, there is a need for improved systems and methods for performing power-efficient volatile memory refresh.

SUMMARY OF THE DISCLOSURE

Systems, methods, and computer programs are disclosed for refreshing a volatile memory. An embodiment of a method comprises storing, in a volatile memory device comprising a cell array having a plurality of rows with a corresponding row address, a table specifying one of a data valid indicator and a data invalid indicator for each of the plurality of row addresses. The data valid indicator specifies that the corresponding row is in use, and the data invalid indicator specifies that the corresponding row is not in use. A memory controller initiates a refresh command. In response to the refresh command, the rows having the data valid indicator are refreshed while the rows having the data invalid indicator are skipped.

An embodiment of a system for refreshing volatile memory comprises a system on chip (SoC) and a volatile random access memory. The SoC comprises a memory controller electrically coupled to the volatile random access memory. The volatile random access memory comprises a cell array and a table. The cell array comprises a plurality of rows with a corresponding row address. The table specifies one of a data valid indicator and a data invalid indicator for each of the plurality of row addresses. The data valid indicator specifies that the corresponding row is in use and the data invalid indicator specifies that the corresponding row is not in use. The volatile random access memory is configured to refresh, in response to a refresh command from the memory controller, the rows having the data valid indicator while skipping the rows having the data invalid indicator.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 7 illustrates a plurality of designated commands sent to the volatile memory for updating the memory-side data valid bit map of FIG. 4.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G"), fourth generation ("4G"), fifth generation ("5G") and other wireless technology, greater bandwidth availability has enabled more portable computing devices with a greater variety of wireless capabilities.

Figure 1:
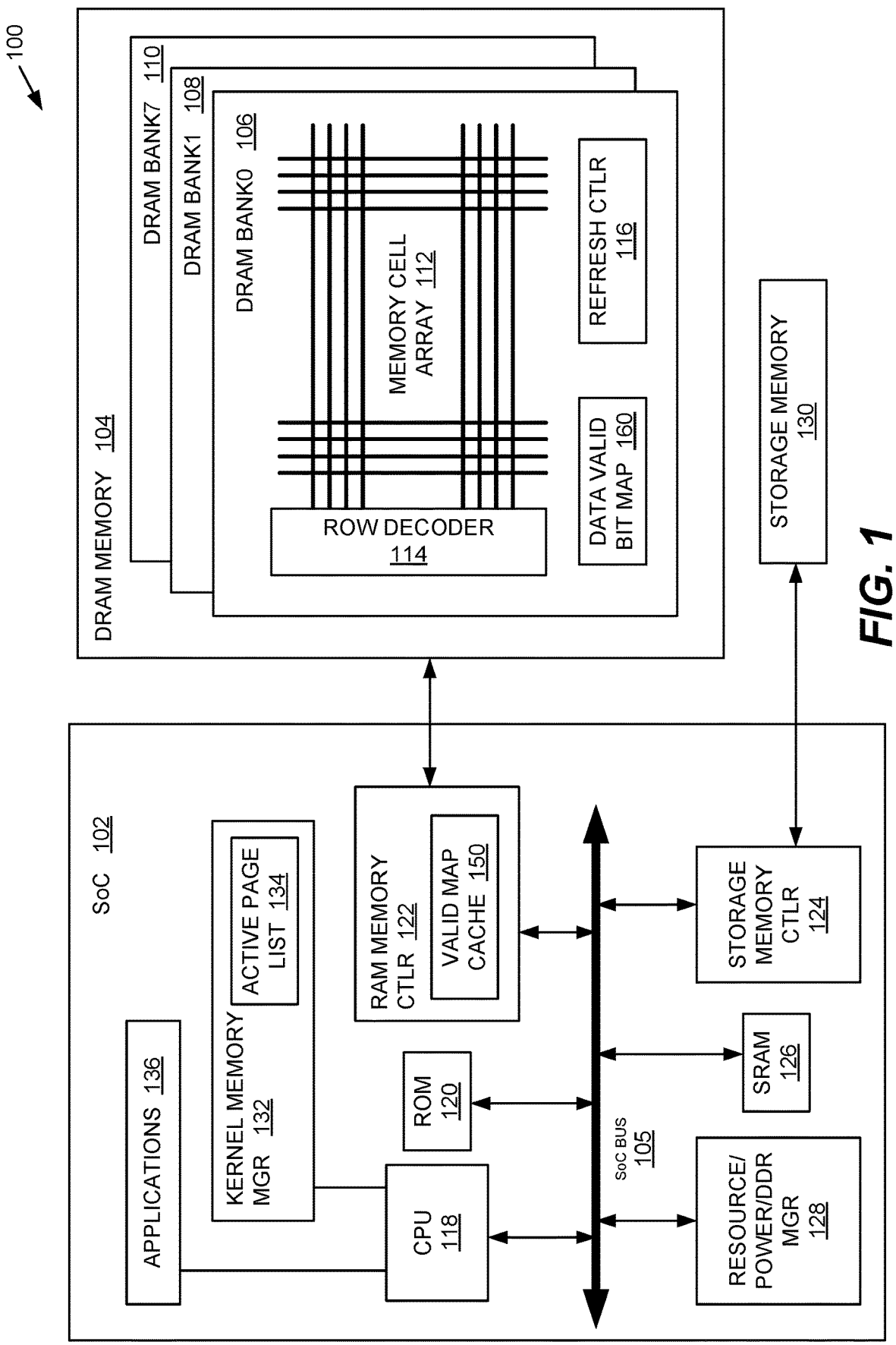
FIG. 1 is a block diagram of an embodiment of a system for providing selective volatile memory refresh via memory-side data valid/invalid indication.

FIG. 1 illustrates an embodiment of a system 100 for providing a power-saving selective volatile memory refresh feature. It should be appreciated that system 100 may be implemented in any computing device, including a personal computer, a workstation, a server, a laptop computer, a gaming console, and a portable computing device (PCD), such as a cellular telephone, a smartphone, a portable digital assistant (PDA), a portable game console, a navigation device, a tablet computer, a fitness computer, and a wearable device (e.g., a sports watch, a fitness tracking device, etc.) or other battery-powered devices with a wireless connection or link.

As illustrated in FIG. 1, the system 100 comprises a system on chip (SoC) 102 electrically coupled to a volatile memory. In the embodiment of FIG. 1, the volatile memory comprises a dynamic random access memory (DRAM) 104 electrically coupled to the SoC 102 via a double data rate (DDR) interface. DRAM 104 may comprise one or more DRAM chips with each chip having a plurality of banks (e.g., bank0 106, bank1 108 . . . bank7 110). Each bank may comprise a memory cell array 112. As known in the art, memory cell array 112 comprises a plurality of memory cell elements arranged in rows (wordlines) and columns (bitlines). Each memory cell has a unique location or address defined by the intersection of the bidines and wordlines. A row decoder 114 is connected to the wordlines and determines according to a row address the particular row of memory cells associated with a bank operation (e.g., read, write, refresh, etc.). As described below in more detail, refresh controller 116 communicates with row decoder 114 to perform various refresh operations.

As illustrated in FIG. 1, the SoC 102 comprises various on-chip components electrically coupled via SoC bus 105. For example, the SoC 102 comprises one or more processing units with central processing unit (CPU) 118 being illustrated. Other potential processing units include graphics processing units (GPUs), digital signal processing units (DSPs) and neural network processing units (NPUs). Collectively, such processing units may be referred to as "memory clients."

The SoC 102 may further comprise a static random access memory (SRAM) 126, read only memory (ROM) 120, a DRAM controller 122, a storage memory controller 124, and a resource/power/DDR manager 128 interconnected via SoC bus 105. The CPU 118 may support a high-level operating system (HLOS) and execute one or more applications 136. The HLOS supports a kernel memory manager 132 configured to provide memory allocation and memory monitoring functions, including management of an active page list 134.

For example, in an embodiment, a Linux kernel may manage the active page list 134 by tracking all pages having a "PG_active" flag with a "true" value. In Linux systems, the PG_active flag may not indicate all the HLOS pages that are actually in use by the userspace and the kernel. Kernel data structure allocations may be hosted by pages that do not have the PG_active flag set. To aid memory reclaim (e.g., the process/algorithm that works to free up memory when system is low on memory), the Linux kernel may maintain four lists for userspace memory mapped (mmap) pages: active file, inactive file, active anonymous, and inactive anonymous.

Pages in the active file and active anonymous lists may be marked with the PG_active flag and the kernel migrates pages between the active file and the inactive file or the active anonymous and the inactive anonymous depending on page references/usage. When the system is low on memory, the kernel may use the inactive lists to free up some pages (which might include writing back dirty pages to back-up storage for an inactive file or to swap space for the inactive anonymous).

If a page in the inactive list gets accessed/used, it may cause the kernel to migrate it to the active list. These lists are one source of memory to reclaim from but there are also other areas where the memory can be and is freed from when there is a need to free more memory as part of memory reclaim. There are also actions, such as, killing an app that can help free memory. It should be appreciated that, in other embodiments, a free page list may be implemented, which keeps track of free pages in the system in an architecture-independent manner. For example, the system 100 may comprise a free page list per migrate type per order per zone per node, as well as, per CPU pages (PCP) list per migrate type per zone per node for order 0 allocations for improved performance.

The storage memory controller 124 may be electrically coupled via a storage bus to external non-volatile storage memory 130, such as, for example, flash memory or other non-volatile memory device(s). DRAM controller 122 controls communication with DRAM 104. Resource/power/DDR manager 128 monitors demand, such as, DDR bandwidth and latency requested by SoC processors (e.g., CPU 118 or CPU (not shown)) and dynamically adjusts operational parameters (e.g., supply voltages and clock frequencies) in order to provide the necessary SoC bus and DRAM performance within an arbitrary period of time.

In general, the system 100 provides power-saving selective volatile memory refresh by monitoring SoC-side memory usage and, in response, generating and maintaining a memory-side mapping of which rows in memory cell array 112 contain valid data and are to be selectively refreshed. Each bank in DRAM 104 may store a data valid/invalid table (e.g., data valid bit map 160) identifying each of the corresponding row addresses with an indicator value. A valid indicator value specifies that the corresponding raw contains valid data and is currently in use by memory clients on SoC 102. An invalid value specifies that the corresponding row does not contain valid data and is not currently in use by memory clients on SoC 102. During a refresh operation, refresh controller 116 accesses the memory-side data valid bit map 160 to determine which rows are to be selectively refreshed. For example, rows having a valid value (indicating that the row is in use) may be refreshed while rows having an invalid value (indicating that the row is not in use) may be skipped.

It should be appreciated that selective volatile memory refresh via memory-side data valid/invalid indication provides many advantages. For example, it may provide finer granularity than existing per-bank or per-segment solutions. As mentioned above, DRAM technology provides refresh power-saving features, such as, partial array self-refresh (PASR), but the coarse granularity (e.g., tens of MB) may require extra HLOS overhead to migrate pages or kill applications. In conventional solutions, the coarse granularity of PASR typically operates on a per-bank or per-section granularlity (e.g., ⅛th of DDR memory with 8 banks or sections). Considering an exemplary DRAM size of 8 GB with 2 ranks, a rank_size may comprise 4 GB (8 GB/2). All of the DRAM in the rank must be refreshed within a refresh_time (e.g., 32 ms), or 3.9 us per cycle (the refresh_interval). The refresh_time divided by the refresh_interval determines a number of cycles (e.g., 8192 cycles). The row size for each bank may comprise the rank_size/refresh_cycles/banks (i.e., 4 GB/8192/8), which yields a coarse refresh granularity of approximately 65 bytes in each bank.

Figure 4:
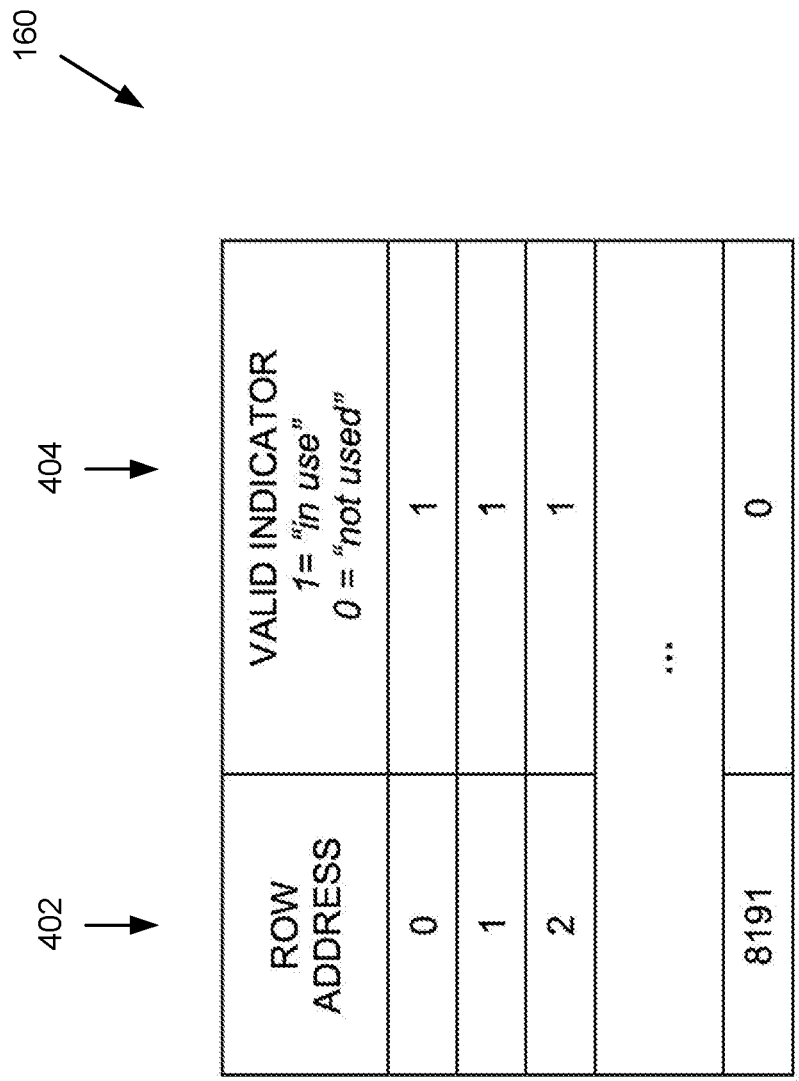
FIG. 4 is a data structure illustrating an exemplary embodiment of the memory-side data valid bit map.

Furthermore, the selective volatile memory refresh via memory-side data valid/invalid indication is a flexible solution that can be adapted to any page table format. As known in the art, page table format is relevant to virtual-to-physical memory management unit (MMU) mapping for the memory that is allocated and needs to be used, and is generally orthogonal to the tracking of memory allocation/usage or freeing/no-usage, which is more relevant for the data valid bit map 160. FIG. 4 illustrates an exemplary embodiment of a data structure for implementing the memory-side data valid bit map 160. Each DRAM bank may store a separate data valid bit map 160 specifying the corresponding row addresses (column 402) in that particular bank. FIG. 4 illustrates an example in which a DRAM bank comprises 8192 rows with row addresses 0-8191. Each row address in the memory-side data valid bit map 160 has an associated data valid bit identifier in column 404. A bit value of "1" for the data valid bit identifier indicates that the corresponding row has valid data because it is currently in use by one or more SoC memory clients. A bit value of "0" for the data valid bit identifier indicates that the corresponding row has invalid data because it is not being used. In operation, each refresh_cycle, refresh controller 116 may access the data valid bit map 160 in each DRAM bank (bank0 106, bank1 108 ... bank7 110) to determine which rows are in use. As mentioned above, refresh controller 116 may skip any row address where the data valid bit identifier has the value "0" indicating that the corresponding row has invalid data because it is not being used.

Figure 2:
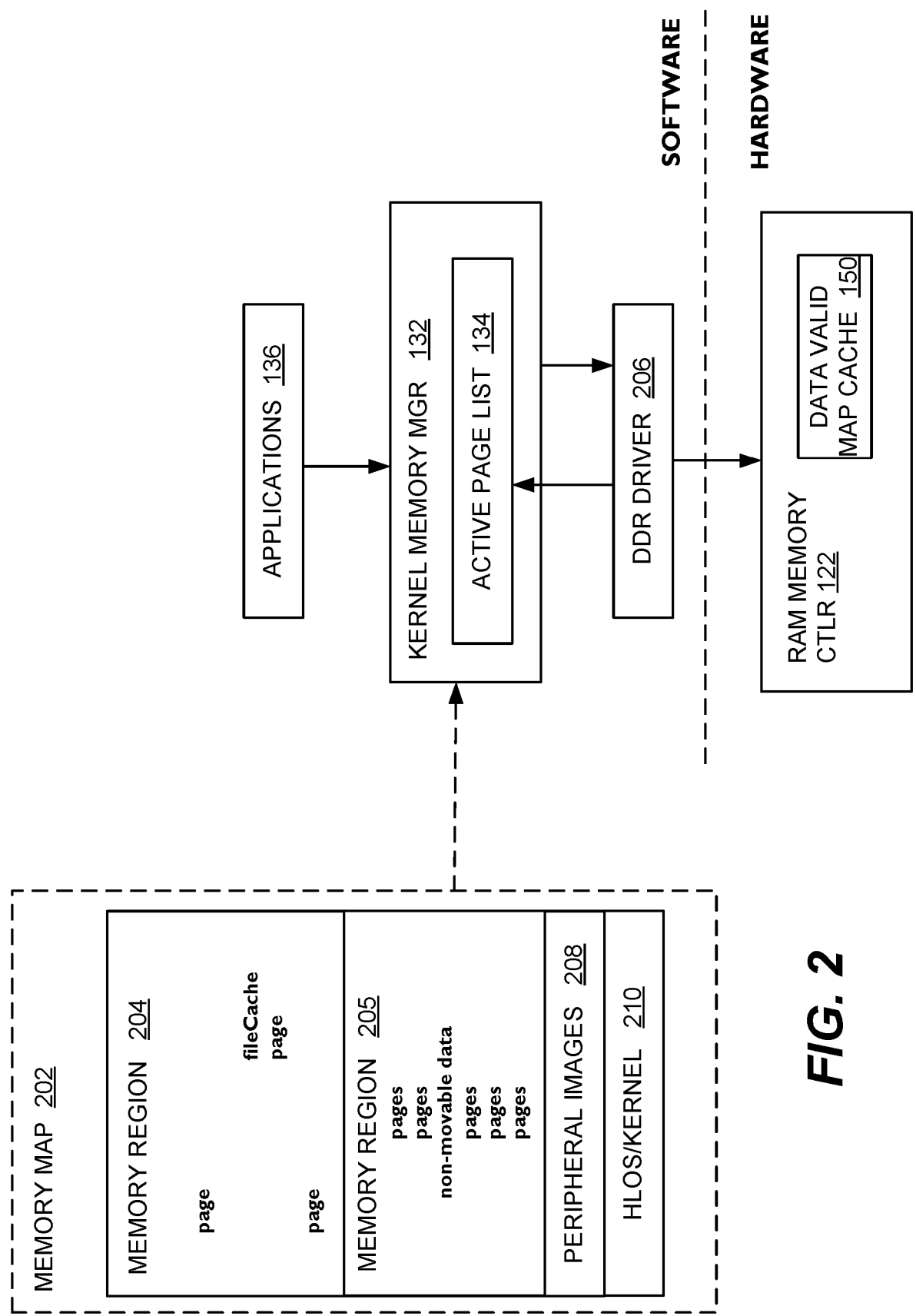
FIG. 2 illustrates an exemplary method for providing data valid/invalid indicators to the memory controller based on a valid page list.

FIG. 2 illustrates an exemplary system and method implemented on the SoC 102 for generating and providing the data valid/invalid indicator values to memory-side data valid bit map 160 based on the active page list 134. During operation, kernel memory manager 132 may maintain a memory map 202 comprising the virtual-to-physical address mapping of the current memory pages that are being used by the applications 136 (i.e., active page list 134). An exemplary memory map 202 comprises memory regions 204, 205, 208 and 210. Memory regions 204 and 205 represent normal HLOS memory that may be used for both user space allocations, as well as kernel allocations, including memory allocated into caches, such as, a page cache. Memory region 208 represents carveout memory for peripheral images that may not be managed by the HLOS kernel system memory manager. Carveout memory may be used for any data and not necessarily peripheral image code and static data. Some carveout memory may be managed by HLOS memory manager(s) other than the HLOS kernel system memory manager, but the same design and principles may be extended to have them interface with the DDR driver 206 to inform the memory controller of the memory usage. Furthermore, there may be carveout memory that is not managed by HLOS, in which case it may need to be marked active in the data valid bit map 160 unless there is a non-HLOS entity that manages and/or is aware of memory usage and may inform as such to the DDR driver 206. Memory region 210, or a subset thereof, may host the HLOS kernel code and static data, which would be marked as active in the data valid bit map 160. In this regard, only the specific subset of memory hosting kernel code and data may be marked as active and not the entire region, necessarily, if there is more memory in the region than what is required to host kernel code and static data, which is typically the case.

As applications 136 are launched and executed, kernel memory manager 132 may update active page list 134 in response to memory allocation requests and as memory pages are being allocated and freed up. Referring to FIG. 2, kernel memory manager 132 may periodically call a software driver (e.g., DDR driver 206) and pass in an initial and/or updated identification of active pages designated by their physical addresses. Kernel memory manager 132 may specify physical addresses for newly allocated pages that have been added to active page list 132, or newly freed pages that have been removed from active page list 132, DDR driver 206 may convert physical addresses to corresponding row addresses, and update a data valid bit map cache 150 stored in DRAM controller 122.

Figure 6:
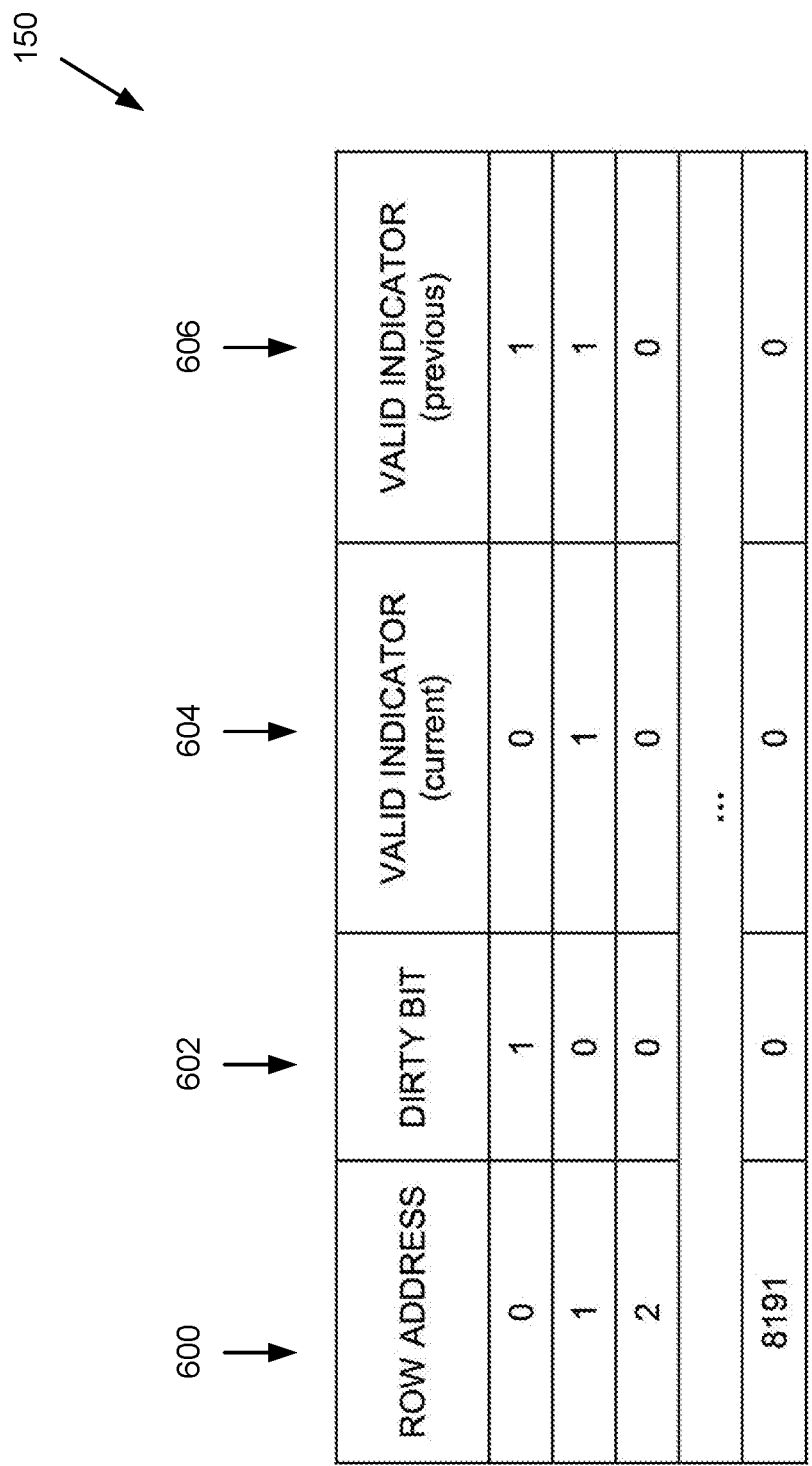
FIG. 6 is a data structure illustrating an exemplary embodiment of the SoC-side data valid map cache.

FIG. 6 is a data structure illustrating an exemplary embodiment of the SoC-side data valid map cache 150 stored in DRAM controller 122. The optional data valid map cache 150 may reduce the frequency of updates to the memory-side data valid map 160, thereby reducing input/output power consumption. As illustrated in FIG. 6, the data valid map cache 160 may be configured in a manner similar to data valid map 160. A current value of the data valid bit identifier for each row address may be stored in column 604. A previous value of the data valid bit identifier for each row address may be stored in column 606. Column 602 comprises a dirty bit indicating a value of "1" if the data valid bit value has changed between the current value and the previous value. In the example of FIG. 6, the data valid bit value for row address 0 has changed from a previous value of "1" to a current value of "0" indicating that the row is no longer in use and needs to be updated. The dirty bit has a value of "0" where the data valid bit value remains unchanged (e.g., row address 1) and does not need to be updated.

Figure 3:
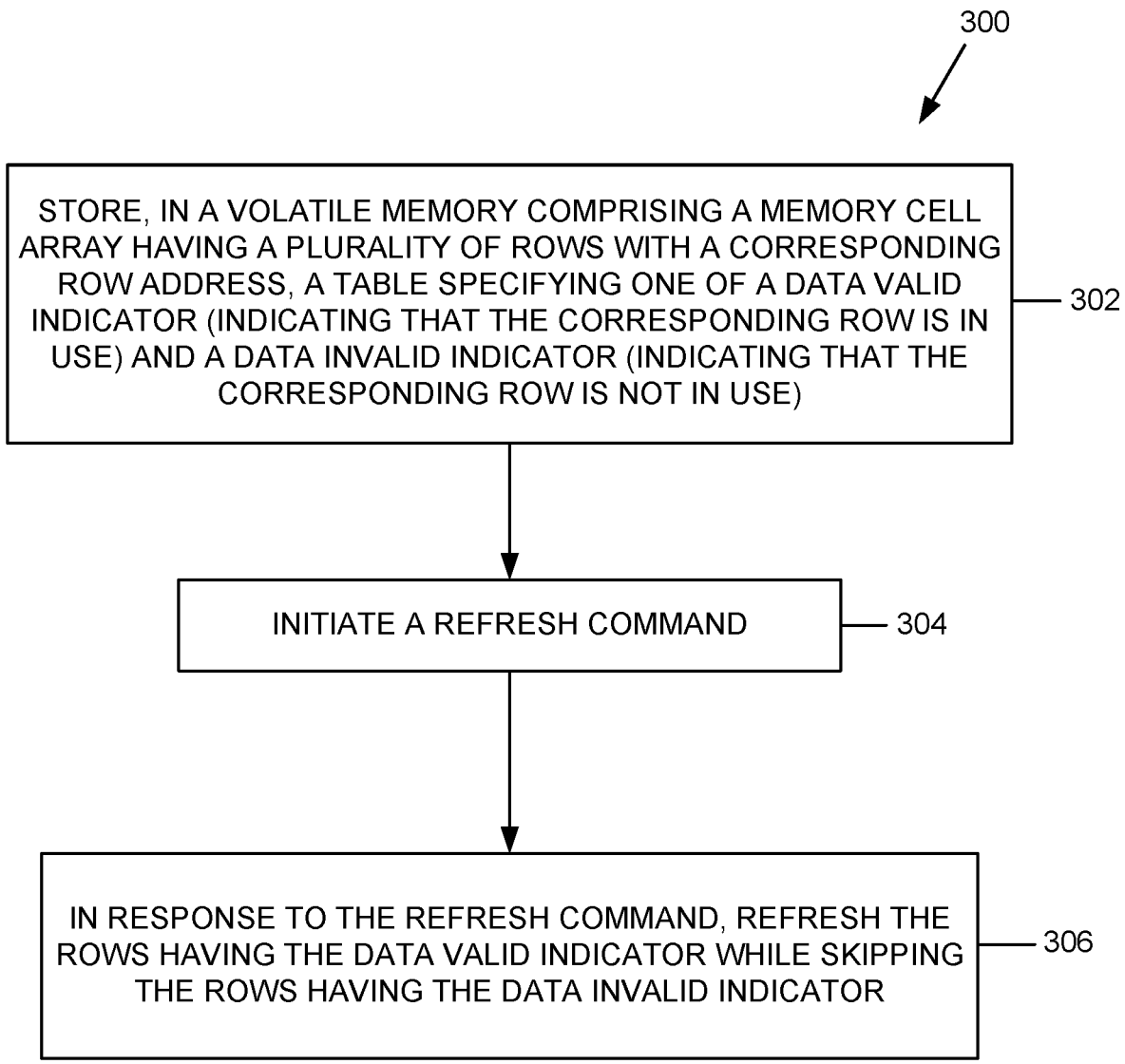
FIG. 3 is a flowchart illustrating an embodiment of a method for selectively refreshing the volatile memory via memory-side data valid/invalid indication.

FIG. 3 is a flowchart illustrating an embodiment of a method 300 for selectively refreshing DRAM 104. At block 302, memory controller 122 may initialize or update data valid bit map 160 stored in one or more banks 106, 108, and 110 defining memory cell array 112. As mentioned above, memory cell array 112 comprises a plurality of rows with a corresponding row address. Each bank may store a corresponding valid bit map 160, which specifies one of a data valid indicator (e.g., data valid bit value 1) and a data invalid indicator (e.g., data valid bit value 0) for each of the plurality of row addresses. At block 304, DRAM controller 122 may initiate a refresh command (e.g., an auto-refresh command, a self-refresh command, etc.). In response to the refresh command, at block 306, refresh controller 116 accesses data valid bit map 160 and refreshes the rows having the data valid indicator while skipping the rows having the data invalid indicator.

Figure 5:
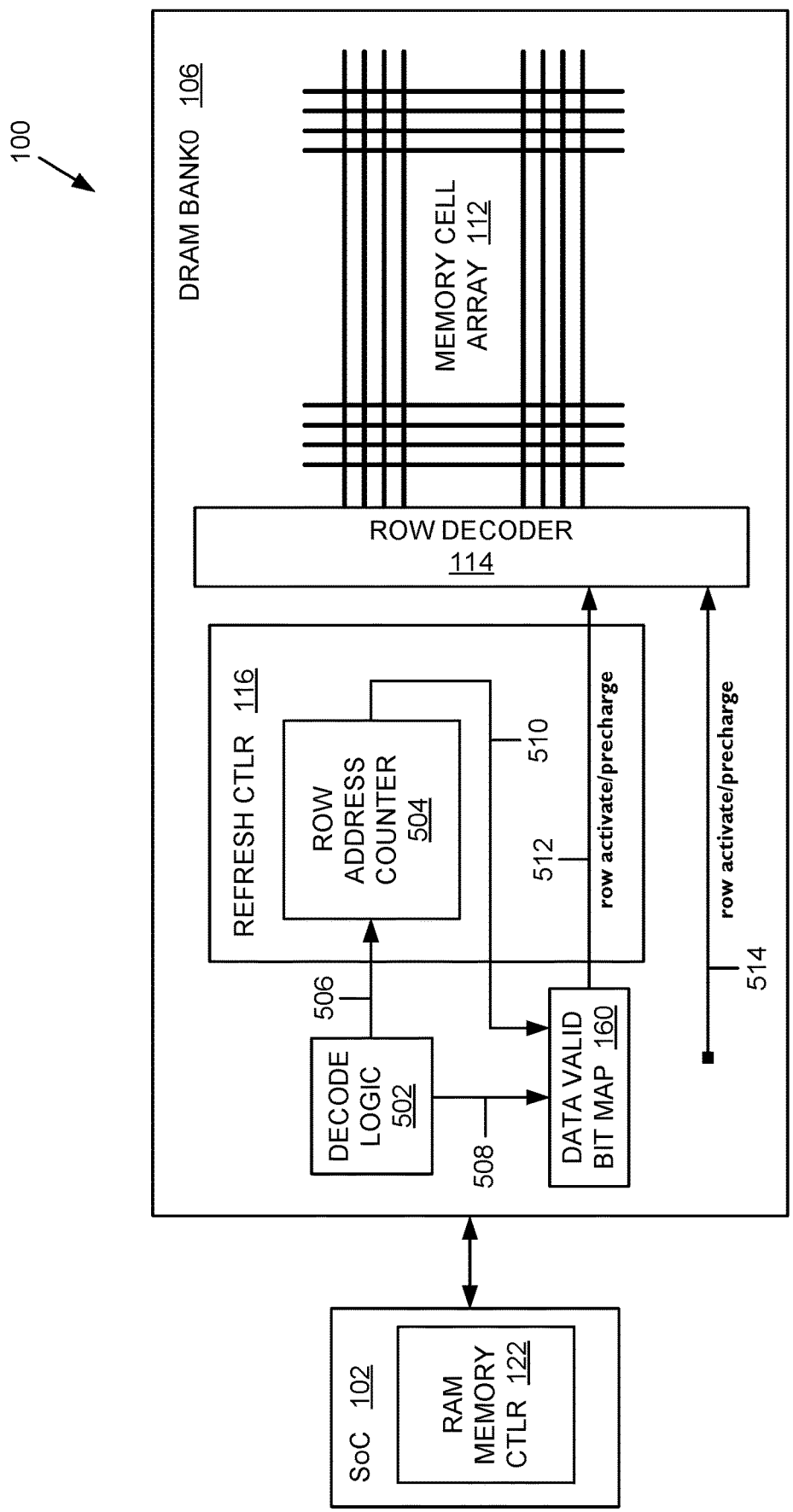
FIG. 5 is a block diagram illustrating an exemplary embodiment of the refresh controller for providing selective volatile memory refresh.

FIG. 5 is a block diagram illustrating an exemplary embodiment of refresh controller 116. Refresh controller 116 comprises a row address counter 504 coupled to decode logic 502 via connection 506 and data valid bit map 160 via connection 510. RAM memory controller 122 may issue periodic auto-refresh commands (e.g., every 3.9 us) with decode logic 502 determining the correct handling of the command. The auto-refresh command may include information such as whether the refresh should apply to all banks or to a specific bank, as well as whether the valid indicator bit 404, 606, 700 should be ignored for the current row in the data valid hit map 160. The reason for ignoring the valid indicator bit may arise, for example, if the valid bit is dirty in the valid map cache 150 and the data valid bit map 160 is therefore incorrect, possibly resulting in data loss. At each refresh cycle, row address counter 504 may access data valid bit map 160. The row address counter 504 may increment during each auto-refresh command, consult the data valid bit map 160, and proceed with a refresh operation if either the valid indicator for the current row says "in use" or if the auto-refresh command contains the ignore flag. If the auto-refresh command does not set the ignore flag and the data valid indicator for the current row says, "not used", then the refresh operation may not occur. As farther illustrated in FIG. 5, when a row is to be selectively refreshed, an activate/precharge command may be sent to row decoder 114 via connection 512. Refresh controller 116 may support a legacy refresh operation, which does not employ selective row refresh, via another connection 514.

Figure 8:
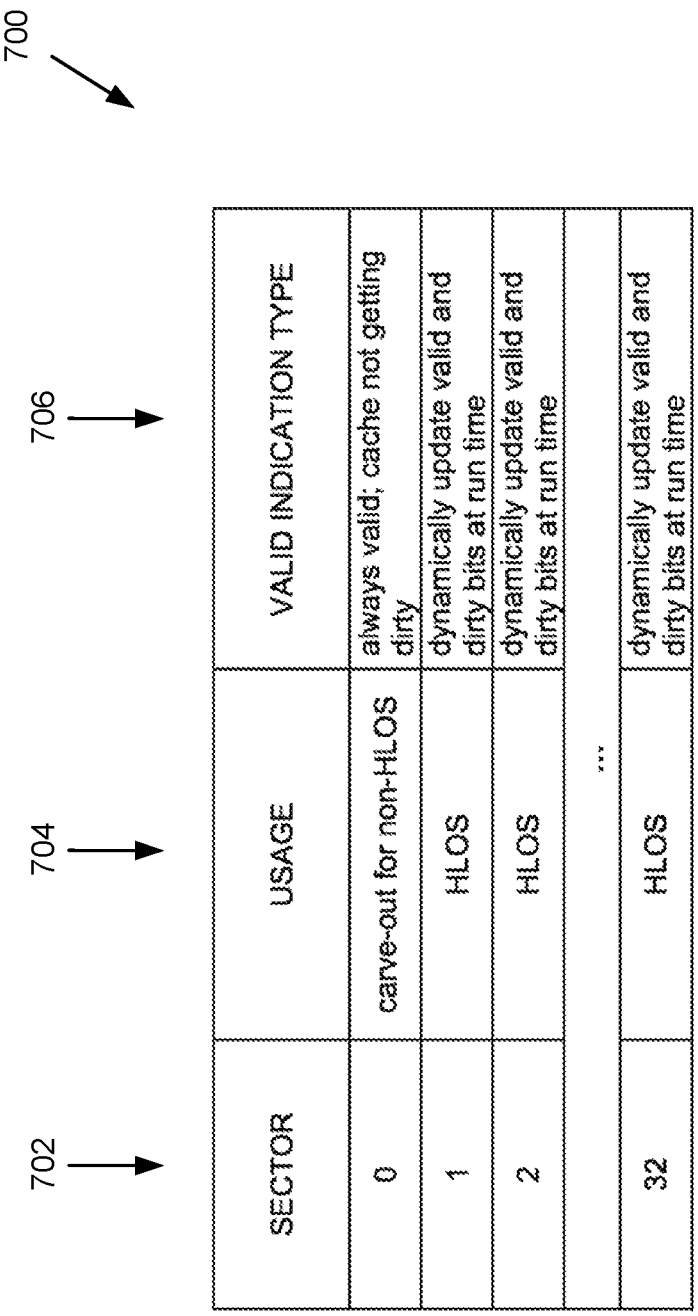
FIG. 8 is a table identifying a usage description and valid indication type for the memory-side data valid bit map.

It should be appreciated that memory-side data valid bit map 160 stored in DRAM 104 may be updated by DRAM controller 122 with a specially-configured VUPDATE command, which is exclusively used to write and/or update the data. The VUPDATE command may comprise a command field to specify one of a plurality of sectors. FIG. 7 illustrates an example of the VUPDATE command sent from the DRAM controller 122 to the volatile memory 104 in order to update memory-side data valid bit map 160. In an exemplary embodiment, the command comprises a plurality of 256-bit sectors (sectors 1-32), each one of the 256-bit sectors indicate the validity of the corresponding row in the volatile memory 104. In this example, the command field for selecting a sector comprises a 5-bit field. FIG. 8 illustrates an exemplary usage of the sectors illustrated in FIG. 7. As illustrated in FIG. 8, one of the sectors (e.g., a sector 0) may be used for carveout memory that is not managed by HLOS kernel system memory manager. In this regard, the carveout memory for non-HLOS usage may always be marked as active in the data valid bit map 160. The rest of the normal HLOS memory (e.g., sectors 1-32) may be managed by the HLOS kernel system memory manager and dynamically updated to indicate invalid when a row worth of contiguous memory is freed and indicate valid when one or more pages within the row are allocated. It should be appreciated, however, that in other embodiments the carveout memory may be used by both non-HLOS and HLOS images.

DRAM controller 122 may configure and send the VUPDATE command to DRAM 104 to update data valid bit map 160 in any of the following, or other situations: (1) when valid bit map cache 150 is updated; (2) prior to sending a refresh command; and (3) before entering a self-refresh mode. A full cache flush operation may be performed when all sectors need to be cleaned of dirty bits. In the event of a full cache flush, all dirty bits are cleared by updating their values to the corresponding locations in the data valid bit map 160. Refresh power refers to a semi-constant drain on the battery that occurs as long as there is DRAM contents to retain. It is a relatively small amount of power, but measured over a long time period (e.g., hours) refresh power can result in significant energy loss. In comparison to DRAM active power, where data is actively read and written, refresh power is small. As a result, a system such as a mobile phone may employ different cache strategies depending on whether the system is idle versus active. When idle, the system may maximize the refresh power savings by keeping the data valid bit map 160 updated continuously with any changes. When very active, the system may rely mainly on the valid bit map cache 150, allowing the data valid bit map 160 to grow stale, and tolerate reduced refresh power savings since the active power consumption dominates. This may result in auto-refresh commands, including the ignore flag, resulting in no savings of refresh operations. In situations that fall between the two extremes, the system may choose a medium frequent updating of the valid bit map 160.

It should be appreciated that an auto-refresh command may be used to trigger a refresh cycle in DRAM 104. An extra bit/flag in the refresh command may command refresh controller 116 to follow or ignore the data valid bit map 160 stored in DRAM 104. For example, a value of "1" may indicate that refresh controller 116 is to operate based on data valid bit map 160 (e.g., selective refresh mode), whereas a value of "0" may indicate that refresh controller 116 is to ignore data valid bit map 160 (e.g., legacy refresh mode). This may allow all rows to be refreshed when data valid bit map 160 is uninitialized or stale. A self-refresh command may similarly include an extra bit/flag to indicate that data valid bit map 160 is to be ignored or followed. The refresh controller 116 may be instructed to ignore the data valid bit map 160 for an individual auto-refresh cycle, or multiple refresh cycles by sending repeated auto-refresh commands containing the ignore bit.

For a self-refresh, the ignore hit would be applied for the entire time that the DRAM 104 remains in self-refresh. As an example, before the kernel 132 allocates new memory in a previously invalid (unused) page, it will first update the valid bit for that page, which would be cached in the valid bit map cache 150. The valid bit map cache 150 will now be dirty, and if the cache 150 is not flushed immediately, then the ignore bit in subsequent auto-refresh commands must instruct DRAM 104 to ignore the data valid bit map 160 to ensure that all locations within the DRAM 104 are properly refreshed.

Figure 9:
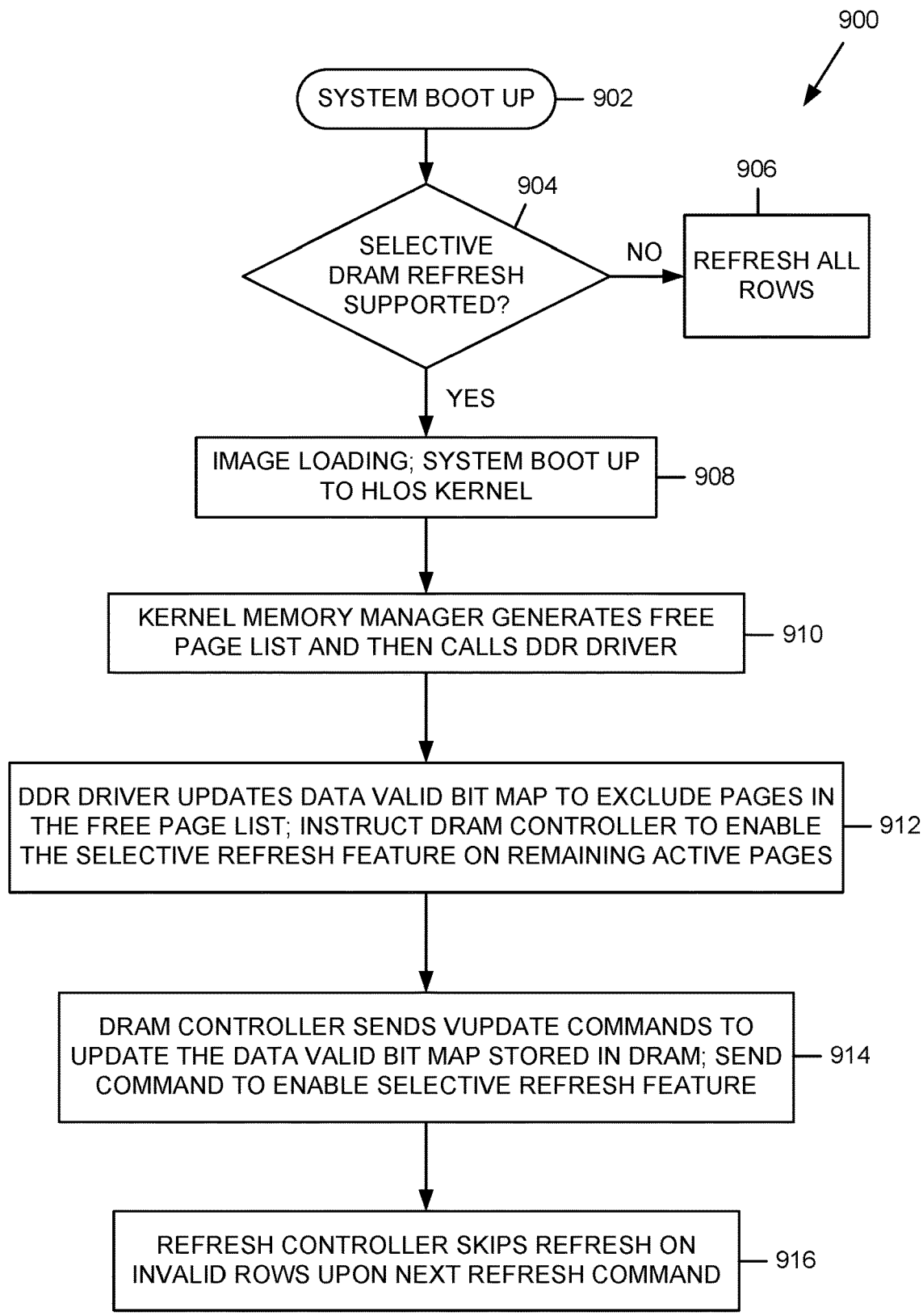
FIG. 9 is a flowchart illustrating an embodiment of a method for initializing the system of FIG. 1.

FIG. 9 is a flowchart illustrating an embodiment of a method 900 for initializing the system 100. At block 902, a system boot sequence is initiated. The system 100 may determine (decision block 904) whether the selective memory refresh feature is supported and/or enabled. If "no", at block 906, the system 100 may operate in a conventional refresh mode without regard to data valid bit map 160. If the selective memory refresh is supported or enabled ("yes"), at block 908, the system 100 may initiate image loading with the system being booted to the HLOS kernel. At block 910, kernel memory manager 132 may generate a free pages list during operation and then call DDR driver 206. At block 912, DDR driver 206 may update data valid bit map cache 150 in DRAM controller 122 to exclude the pages in the free pages, and then instruct DRAM controller 122 to enable the selective memory refresh feature for remaining active pages. At block 914, DRAM controller 122 may send VUPDATE command(s) to update data valid bit map 160, and then send command(s) to enable the selective memory refresh feature. At block 916, refresh controller 116 may skip refresh operations for any rows designated as invalid.

Figure 10:
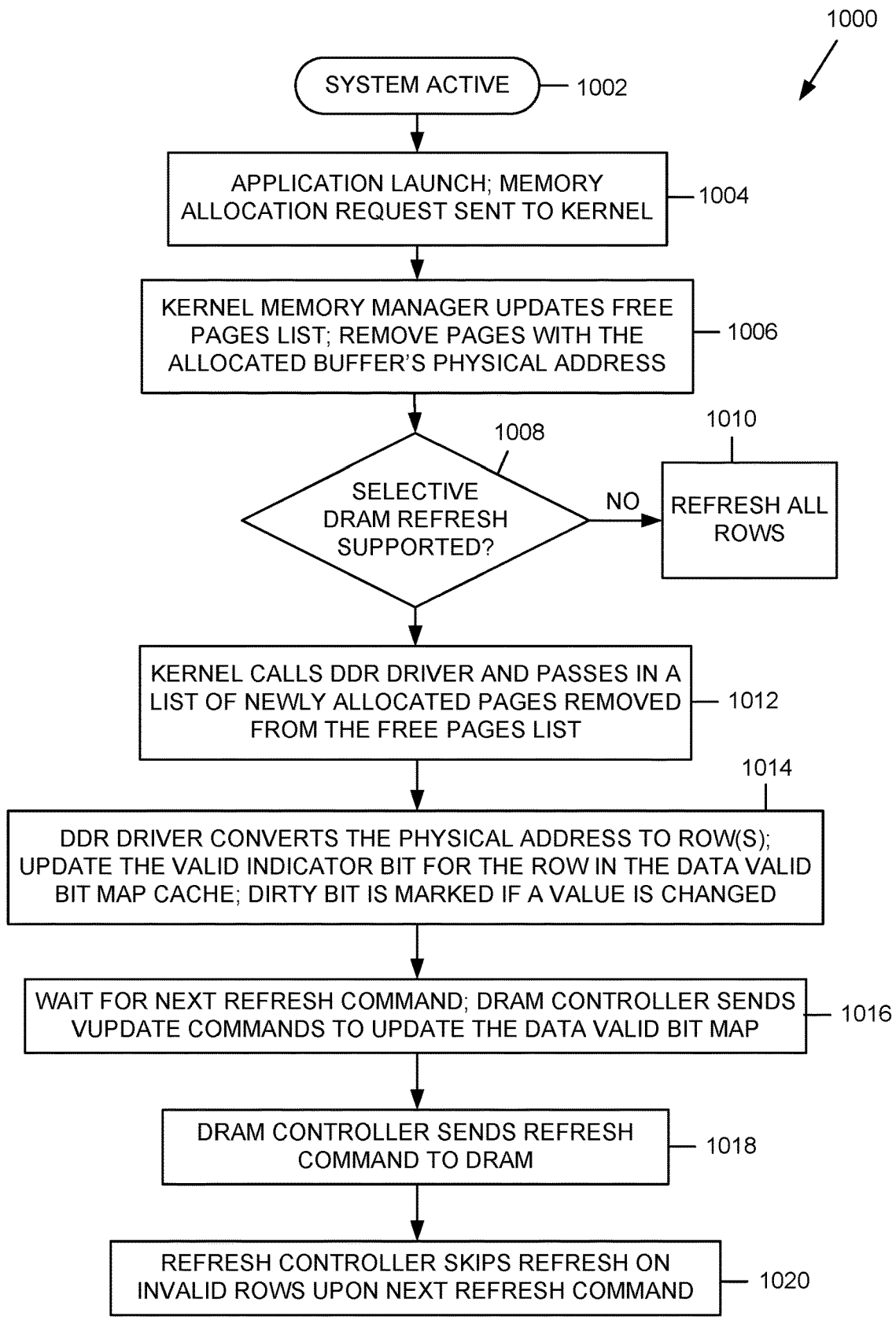
FIG. 10 is a flowchart illustrating an embodiment of a method for updating the data valid bit map in response to new memory allocations.

FIG. 10 is a flowchart illustrating an embodiment of a system runtime method 1000 for updating the data valid bit map 160 in response to new memory allocations. When the system is active (block 1002), one or more applications 136 may be launched with memory allocation requests sent to the HLOS kernel (block 1004). At block 1006, kernel memory manager 132 may update a free pages list in response to new memory allocations and remove pages with the allocated buffer's physical address. If the selective memory refresh feature is not supported or not enabled (decision block 1008), the system 100 may operate (block 1010) in the conventional refresh mode without regard to data valid bit map 160. If selective memory refresh is enabled, at block 1012, the HLOS kernel may call DDR driver 206, and then pass in a list of newly allocated pages removed from the free pages list. At block 1014, DDR driver 206 may convert the physical address(es) to corresponding row(s), and then update the valid indicator bit for the row in data valid bit map cache 150. If the valid indicator bit value has changed, the dirty bit may be set to "1". When it is time for the next refresh command, at block 1016, DRAM controller 122 may send VUPDATE command(s) to update data valid bit map 160. At block 1018, DRAM controller sends the refresh command to DRAM 104 and selective memory refresh is performed in accordance with data valid bit map 160 (block 1020).

The system 100 may include provisions for error handling such as when a DRAM read or write occurs to an invalid un-refreshed page. Normally, the kernel 132 will remain synchronized with the valid bit map cache 150, and will not attempt to read or write an invalid page; the kernel 132 will always first update the data valid bit, causing the page to become refreshed, prior to actually using (writing or reading) the page. If this synchronization contains errors and somehow the applications 136 or kernel 132 are allowed to use invalid pages, potential catastrophic consequences (i.e crash, failure, data loss) may occur.

As a precaution, the SoC 102 may include features to monitor the address of any read or write transaction, compare this address against the valid bits in the data valid bit map cache 150, then return a predetermined error value and/or enact a predetermined error handling response. Alternatively, DRAM 104 may include features to monitor the address of any read or write transaction, compare this address against the valid bits in the data valid bit map 160, then return a predetermined error value and/or enact a predetermined error handling response.

Figure 11:
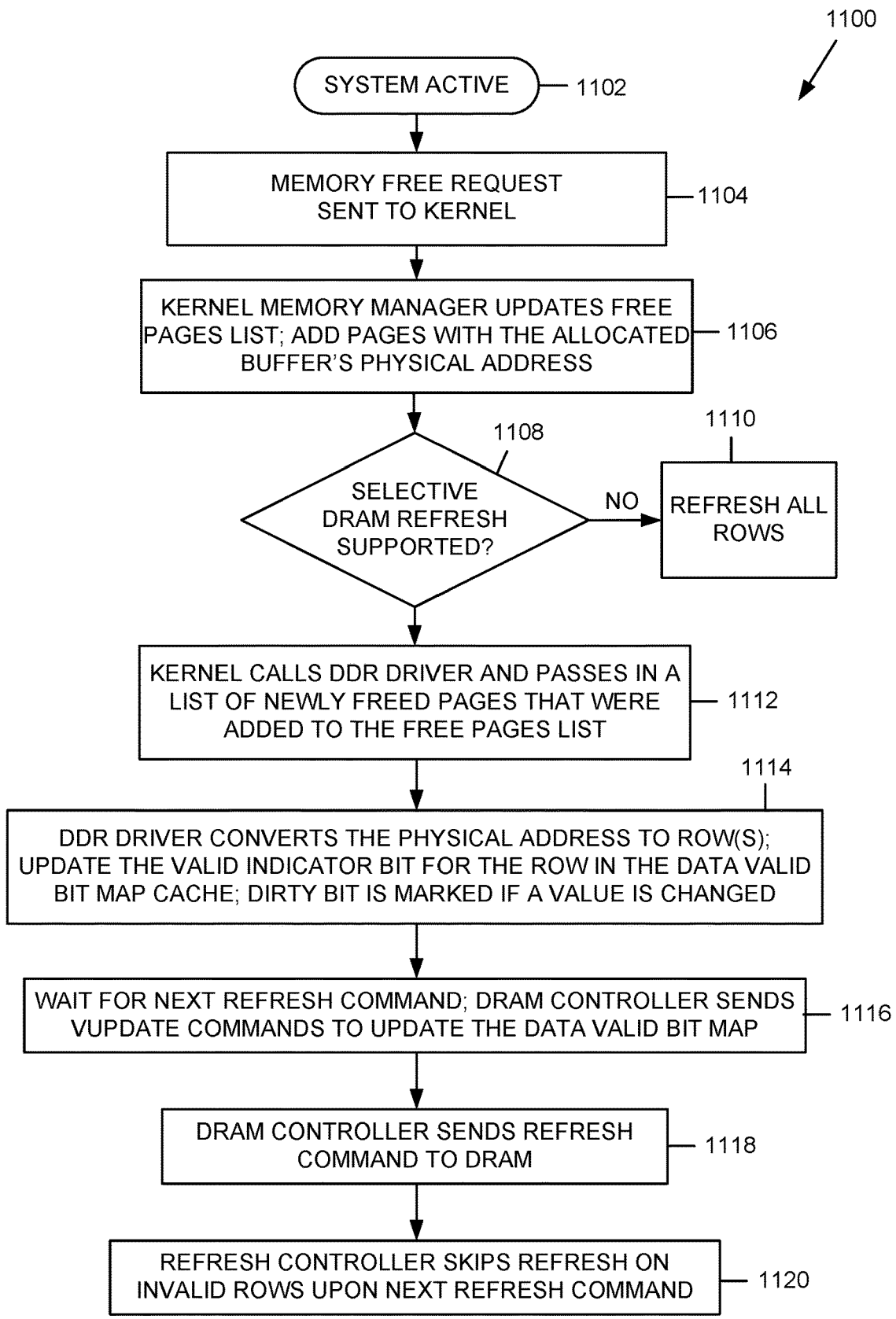
FIG. 11 is a flowchart illustrating an embodiment of a method for updating the data valid bit map in response to memory free requests.

FIG. 11 is a flowchart illustrating an embodiment of a system runtime method 1100 for updating data valid bit map 160 in response to memory free requests. When the system is active (block 1102), memory free requests may be sent to the HLOS kernel (block 1104). At block 1106, kernel memory manager 132 may update the free pages list in response to the freeing up of pages, and then add the pages with the allocated buffer's physical address. If the selective memory refresh feature is not supported or not enabled (decision block 1108), the system 100 may operate (block 1110) in the conventional refresh mode without regard to data valid bit map 160. If selective memory refresh is enabled, at block 1112, the HLOS kernel may call DDR driver 206, and then pass in a list of newly freed pages that were added to the free pages list. At block 1114, DDR driver 206 may convert the physical address(es) to corresponding row(s), and then update the valid indicator bit for the row in data valid bit map cache 150. If the valid indicator bit value has changed, the dirty bit may be set to "1". When it is time for the next refresh command, at block 1116, DRAM controller 122 may send VUPDATE command(s) to update data valid bit map 160. At block 1118, DRAM controller 122 sends the refresh command to DRAM 104 and selective memory refresh is performed in accordance with data valid bit map 160 (block 1020).

Figure 12:
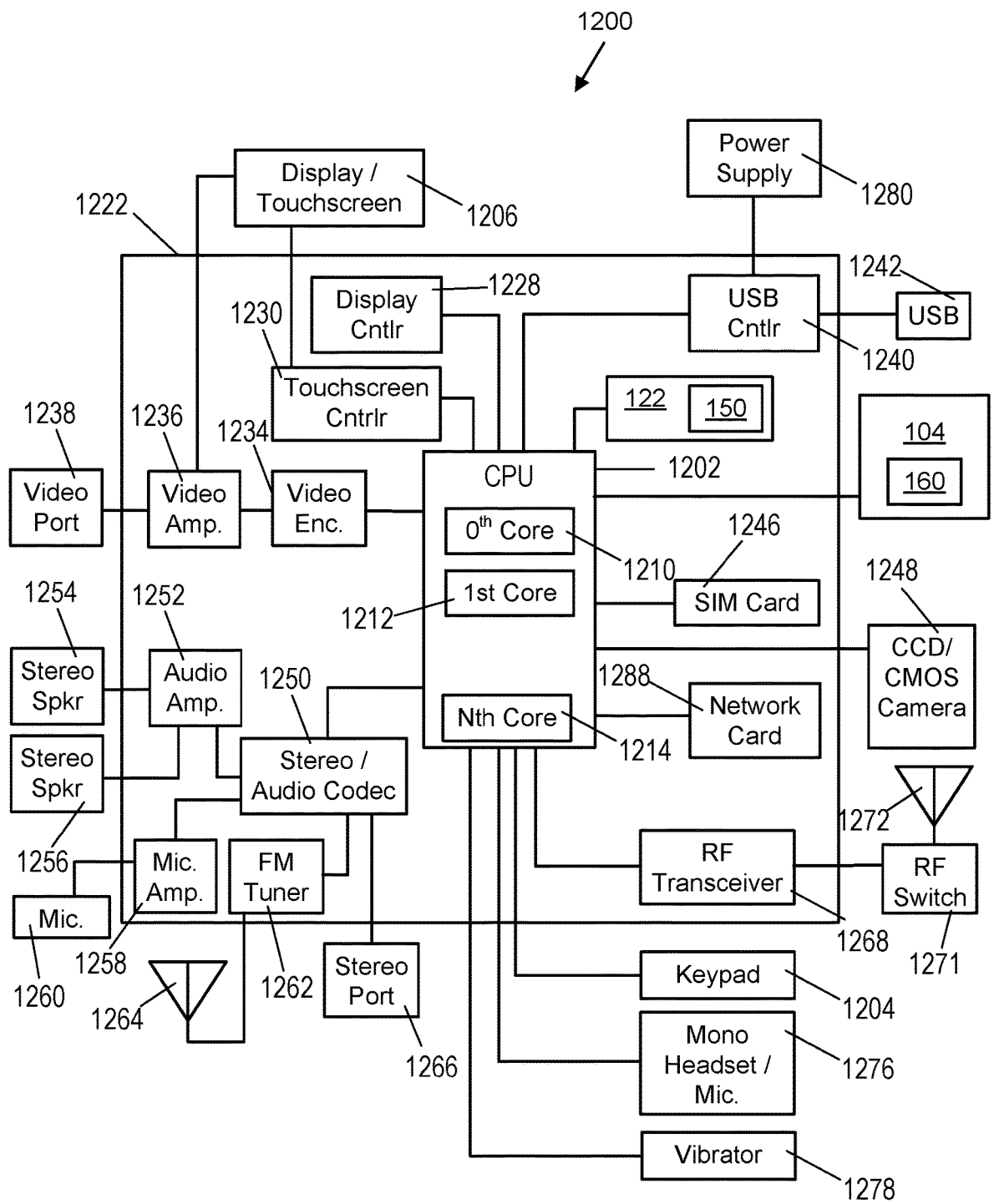
FIG. 12 is a block diagram of an embodiment of a portable computing device that may incorporate the systems and methods of FIGS. 1-11.

As mentioned above, the system 100 may be incorporated into any desirable computing system. FIG. 12 illustrates the system 100 incorporated in an exemplary portable computing device (PCD) 1200. It will be readily appreciated that certain components of the system 100 may be included on the SoC 1222 (e.g., DRAM controller 122, data valid bit map cache 150, kernel memory manager 132) while other components (e.g., DRAM 104, refresh controller 116, data valid bit map 160) may be external components coupled to the SoC 1222. The SoC 1222 may include a multicore CPU 1202. The multicore CPU 1202 may include a zeroth core 1210, a first core 1212, and a Nth core 1214. One of the cores may comprise, for example, a graphics processing unit (GPU) with one or more of the others comprising the CPU 1202 for supporting the HLOS and kernel memory manager 132.

A display controller 1228 and a touch screen controller 1230 may be coupled to the CPU 1202. In turn, the touch screen display 1206 external to the on-chip system 1222 may be coupled to the display controller 1228 and the touch screen controller 1230.

FIG. 12 further shows that a video encoder 1234, e.g., a phase alternating line (PAL) encoder, a sequential color a memoire (SECAM) encoder, or a national television system(s) committee (NTSC) encoder, is coupled to the multicore CPU 1202. Further, a video amplifier 1236 is coupled to the video encoder 1234 and the touch screen display 1206. Also, a video port 1238 is coupled to the video amplifier 1236. As shown in FIG. 12, a universal serial bus (USB) controller 1240 is coupled to the multicore CPU 1202. Also, a USB port 1242 is coupled to the USB controller 1240.

Further, as shown in FIG. 12, a digital camera 1248 may be coupled to the multicore CPU 1202. In an exemplary aspect, the digital camera 1248 is a charge-coupled device (CCD) camera or a complementary metal-oxide semiconductor (CMOS) camera.

As further illustrated in FIG. 12, a stereo audio coder-decoder (CODEC) 1250 may be coupled to the multicore CPU 1202. Moreover, an audio amplifier 1252 may coupled to the stereo audio CODEC 1250. In an exemplary aspect, a first stereo speaker 1254 and a second stereo speaker 1256 are coupled to the audio amplifier 1252. FIG. 12 shows that a microphone amplifier 1258 may be also coupled to the stereo audio CODEC 1250. Additionally, a microphone 1260 may be coupled to the microphone amplifier 1258. In a particular aspect, a frequency modulation (FM) radio tuner 1262 may be coupled to the stereo audio CODEC 1250. Also, an FM antenna 1264 is coupled to the FM radio tuner 1262. Further, stereo headphones 1266 may be coupled to the stereo audio CODEC 1250.

FIG. 12 further illustrates that a radio frequency (RF) transceiver 1268 may be coupled to the multicore CPU

1202. An RF switch 1270 may be coupled to the RF transceiver 1268 and an RF antenna 1272. A keypad 1204 may be coupled to the multicore CPU 1202. Also, a mono headset with a microphone 1276 may be coupled to the multicore CPU 1202. Further, a vibrator device 1278 may be coupled to the multicore CPU 1202.

FIG. 12 also shows that a power supply 1280 may be coupled to the on-chip system 1222. In a particular aspect, the power supply 1280 is a direct current (DC) power supply that provides power to the various components of the PCD 1200 that require power. Further, in a particular aspect, the power supply is a rechargeable DC battery or a DC power supply that is derived from an alternating current (AC) to DC transformer that is connected to an AC power source.

FIG. 12 further indicates that the PCD 1200 may also include a network card 1288 that may be used to access a data network, e.g., a local area network, a personal area network, or any other network. The network card 1288 may be a Bluetooth network card, a WiFi network card, a personal area network (PAN) card, a personal area network ultra-low-power technology (PeANUT) network card, a television/cable/satellite tuner, or any other network card well known in the art. Further, the network card 1288 may be incorporated into a chip, i.e., the network card 1288 may be a full solution in a chip, and may not be a separate network card 1288.

As depicted in FIG. 12, the touch screen display 1206, the video port 1238, the USB port 1242, the camera 1248, the first stereo speaker 1254, the second stereo speaker 1256, the microphone 1260, the FM antenna 1264, the stereo headphones 1266, the RF switch 1270, the RF antenna 1272, the keypad 1274, the mono headset 1276, the vibrator 1278, and the power supply 1280 may be external to the on-chip system 1222.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for refreshing a volatile memory, the method comprising:
    storing, in a volatile memory device comprising a cell array having a plurality of rows with a corresponding row address, a table specifying one of a data valid indicator and a data invalid indicator for each of the plurality of row addresses, the data valid indicator specifying that the corresponding row is in use and the data invalid indicator specifying that the corresponding row is not in use;
    initiating a refresh command from a memory controller;
    in response to the refresh command, refreshing the rows having the data valid indicator while skipping the rows having the data invalid indicator; and
    updating the table stored in the volatile memory based on a current valid page list;
    wherein updating the table comprises:
        a kernel memory manager providing the current valid page list to a memory driver;
        the memory driver converting one or more physical addresses to one or more of the row addresses; and
        a memory controller sending an update command to the volatile memory device.

2. The method of claim 1, wherein the volatile memory device comprises a dynamic random access memory (DRAM) device.

3. The method of claim 2, wherein the DRAM device comprises a plurality of DRAM banks.

4. The method of claim 1, wherein the refresh command comprises an auto-refresh command having an ignore flag.

5. The method of claim 1, further comprising:
caching the table in a memory controller residing on a system on chip electrically coupled to the volatile memory device.

6. A system for refreshing a volatile memory, the system comprising:
means for storing, in a volatile memory device comprising a cell array having a plurality of rows with a corresponding row address, a table specifying one of a data valid indicator and a data invalid indicator for each of the plurality of row addresses, the data valid indicator specifying that the corresponding row is in use and the data invalid indicator specifying that the corresponding row is not in use;
means for initiating a refresh command;
means for refreshing, in response to the refresh command, the rows having the data valid indicator while skipping the rows having the data invalid indicator; and
means for updating the table stored in the volatile memory based on a current valid page list;
wherein the means for updating the table comprises:
a kernel memory manager configured to provide the current valid page list to a memory driver;
the memory driver configured to convert one or more physical addresses to one or more of the row addresses; and
a memory controller sending an update command to the volatile memory device.

7. The system of claim 6, wherein the data valid indicator and the data invalid indicator comprises a valid/invalid bit.

8. The system of claim 6, wherein the volatile memory device comprises a dynamic random access memory (DRAM) device.

9. The system of claim 8, wherein the DRAM device comprises a plurality of DRAM banks.

10. The system of claim 6, wherein the means for initiating the refresh command comprises a memory controller residing on a system on chip electrically coupled to the volatile memory device, and the refresh command comprises an auto-refresh command, wherein the volatile memory device follows or ignores the data valid indicator and the data invalid indicator according to an ignore flag specified in the auto-refresh command.

11. The system of claim 6, further comprising:
means for caching the table in a memory controller residing on a system on chip electrically coupled to the volatile memory device.

12. A computer program embodied in a computer readable medium and executed by a processor for refreshing a volatile memory, the computer program comprising logic configured to:
store, in a volatile memory device comprising a cell array having a plurality of rows with a corresponding row address, a table specifying one of a data valid indicator and a data invalid indicator for each of the plurality of row addresses, the data valid indicator specifying that the corresponding row is in use and the data invalid indicator specifying that the corresponding row is not in use;
initiate a refresh command from a memory controller;
in response to the refresh command, refresh the rows having the data valid indicator while skipping the rows having the data invalid indicator; and
update the table stored in the volatile memory based on a current valid page list and by sending an update data valid bit map (VUPDATE) command to the volatile memory, wherein the VUPDATE command specifies a sector and one or more row validity bits.

13. The computer program of claim 12, wherein the volatile memory device comprises a dynamic random access memory (DRAM) device having a plurality of DRAM banks.

14. The computer program of claim 12, wherein the refresh command comprises an auto-refresh command.

15. The computer program of claim 12, wherein the logic configured to update the table comprises:
a kernel memory manager providing the current valid page list to a memory driver; and
the memory driver converting one or more physical addresses to one or more of the row addresses; and
a memory controller sending an update command to the volatile memory device.

16. The computer program of claim 12, further comprising logic configured to:
cache the table in a memory controller residing on a system on chip electrically coupled to the volatile memory device.

17. A system for refreshing volatile memory, the system comprising:
a system on chip (SoC) comprising a memory controller; and
a volatile random access memory electrically coupled to the memory controller, the volatile random access memory comprising:
a cell array having a plurality of rows with a corresponding row address; and
a table specifying one of a data valid indicator and a data invalid indicator for each of the plurality of row addresses, the data valid indicator specifying that the corresponding row is in use and the data invalid indicator specifying that the corresponding row is not in use;
wherein the volatile random access memory is configured to refresh, in response to a refresh command from the memory controller, the rows having the data valid indicator while skipping the rows having the data invalid indicator;
wherein the memory controller is configured to update the table stored in the volatile random access memory based on a current valid page list;
wherein the SoC comprises a kernel memory manager configured to provide the current valid page list to a memory driver, the memory driver converting one or more physical addresses to one or more of the row addresses, and the memory controller configured to send an update command to the volatile random access memory.

18. The system of claim 17, wherein the volatile random access memory comprises a dynamic random access memory (DRAM) device.

19. The system of claim 18, wherein the DRAM device comprises a plurality of DRAM banks.

20. The system of claim 17, wherein the refresh command comprises an auto-refresh command.

21. The system of claim 17, wherein the memory controller caches the table.

22. The system of claim 17, wherein the data valid indicator and the data invalid indicator comprise a valid/invalid bit.

23. The system of claim 17, wherein the volatile random access memory comprises a refresh controller in communication with the table.

\* \* \* \* \*